United States Patent
Kuroda et al.

(10) Patent No.: US 10,424,841 B2
(45) Date of Patent: Sep. 24, 2019

(54) ANTENNA MATCHING CIRCUIT, ANTENNA CIRCUIT, FRONT-END CIRCUIT, AND COMMUNICATION APPARATUS

(71) Applicant: Murata Manufacturing Co., Ltd., Kyoto (JP)

(72) Inventors: Katsuhito Kuroda, Kyoto (JP); Kengo Onaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/883,593

(22) Filed: Jan. 30, 2018

(65) Prior Publication Data

US 2018/0159220 A1 Jun. 7, 2018

Related U.S. Application Data

(63) Continuation of application No. PCT/JP2016/069216, filed on Jun. 29, 2016.

(30) Foreign Application Priority Data

Jul. 31, 2015 (JP) ................................ 2015-151460

(51) Int. Cl.
*H01Q 9/04* (2006.01)
*H01Q 5/335* (2015.01)
(Continued)

(52) U.S. Cl.
CPC ............. *H01Q 5/335* (2015.01); *H01Q 1/243* (2013.01); *H01Q 5/50* (2015.01); *H01Q 9/0407* (2013.01);
(Continued)

(58) Field of Classification Search
CPC ........ H01Q 5/335; H01Q 5/50; H01Q 9/0407; H01Q 9/42; H01Q 1/243; H03H 7/38;
(Continued)

(56) References Cited

U.S. PATENT DOCUMENTS 5,923,297 A * 7/1999 Kim ....................... H01Q 1/244
343/702
8,320,850 B1 * 11/2012 Khlat ....................... H03H 7/40
455/107
(Continued)

FOREIGN PATENT DOCUMENTS

JP H08-125480 A 5/1996
JP 2004-304435 A 10/2004
(Continued)

OTHER PUBLICATIONS

International Search Report for International Application No. PCT/JP2016/069216 dated Sep. 20, 2016.
(Continued)

*Primary Examiner* — Hoang V Nguyen
(74) *Attorney, Agent, or Firm* — Pearne & Gordon LLP

(57) ABSTRACT

The present disclosure includes a first circuit that is connected between a power feed port and an antenna port, and a second circuit that is connected between the power feed port and the ground or between the antenna port and the ground. The first circuit is a circuit in which for example a first variable capacitance element is connected in series with a first inductor, and the second circuit is a circuit in which for example a second variable capacitance element is connected in parallel with a second inductor. A switch performs switching at least between a first state in which a second end of the second circuit is connected to a first end of the first circuit and a second state in which the second end of the second circuit is connected to a second end of the first circuit.

13 Claims, 21 Drawing Sheets

(51) Int. Cl.
*H03H 7/38* (2006.01)
*H04B 1/04* (2006.01)
*H04B 1/18* (2006.01)
*H01Q 1/24* (2006.01)
*H03H 7/01* (2006.01)
*H01Q 9/42* (2006.01)
*H01Q 5/50* (2015.01)
*H03H 1/00* (2006.01)

(52) U.S. Cl.
CPC ............ *H01Q 9/42* (2013.01); *H03H 7/0115* (2013.01); *H03H 7/175* (2013.01); *H03H 7/1766* (2013.01); *H03H 7/1775* (2013.01); *H03H 7/38* (2013.01); *H04B 1/04* (2013.01); *H04B 1/0458* (2013.01); *H04B 1/18* (2013.01); *H03H 2001/0085* (2013.01); *H03H 2007/386* (2013.01)

(58) Field of Classification Search
CPC ...... H03H 7/0115; H03H 7/1766; H04B 1/04; H04B 1/18
See application file for complete search history.

(56) References Cited

U.S. PATENT DOCUMENTS

| | | |
|---|---|---|
| 2006/0145782 A1 | 7/2006 | Liu et al. |
| 2011/0221543 A1 | 9/2011 | Schmidhammer |
| 2011/0227666 A1 | 9/2011 | Manssen et al. |
| 2015/0118984 A1* | 4/2015 | Nagumo ............ H04B 1/0458 455/193.1 |
| 2016/0043468 A1 | 2/2016 | Onaka |

FOREIGN PATENT DOCUMENTS

| | | |
|---|---|---|
| JP | 2007-174034 A | 7/2007 |
| JP | 2008-527808 A | 7/2008 |
| JP | 2012-505580 A | 3/2012 |
| WO | 01-48934 A1 | 5/2001 |
| WO | 2014-181569 A1 | 11/2014 |

OTHER PUBLICATIONS

Written Opinion for International Application No. PCT/JP2016/069216 dated Sep. 20, 2016.

* cited by examiner

FIG. 13

| COMMUNICATION BAND | L2 | C2 | L1 | C1 |
|---|---|---|---|---|
| Band12 | 10nH | 5.0pF | 30nH | 4.05pF |
| Band28 | 10nH | 4.4pF | 30nH | 2.5pF |
| Band13 | 10nH | 4.2pF | 30nH | 1.94pF |
| Band20 | 10nH | 3.6pF | 30nH | 1.32pF |
| Band5 | 10nH | 2.8pF | 30nH | 1.12pF |
| Band8 | 10nH | 4.5pF | 30nH | 1.0pF |

FIG. 17

| IMPEDANCE TRANSFORMATION | L11 | C11 | L12 | C12 | L13 |
|---|---|---|---|---|---|
| LPF50-50 | 9.16nH | 4.68pF | 12.15nH | 3.58pF | 5.13nH |
| LPF30-50 | 6.70nH | 5.73pF | 10.87nH | 4.35pF | 5.24nH |
| LPF10-50 | 1.88nH | 5.71pF | 6.35nH | 6.35pF | 1.92nH |

| IMPEDANCE TRANSFORMATION | C31 | L31 | C32 | L32 | C33 |
|---|---|---|---|---|---|
| HPF50-50(LPF50-50) | 1.57pF | 3.11nH | 1.27pF | 3.71nH | 3.21pF |
| HPF50-50(LPF30-50) | 1.53pF | 2.7nH | 1.53pF | 4.07nH | 8.37pF |
| HPF50-50(LPF10-50) | 1.22pF | 2.18nH | 1.34pF | 4.23nH | 100pF |

ANTENNA MATCHING CIRCUIT, ANTENNA CIRCUIT, FRONT-END CIRCUIT, AND COMMUNICATION APPARATUS

This is a continuation of International Application No. PCT/JP2016/069216 filed on Jun. 29, 2016 which claims priority from Japanese Patent Application No. 2015-151460 filed on Jul. 31, 2015. The contents of these applications are incorporated herein by reference in their entireties.

BACKGROUND OF THE DISCLOSURE

Field of the Disclosure

The present disclosure relates to an antenna matching circuit that is connected to an antenna and that adjusts antenna characteristics, an antenna circuit, a front-end circuit, and a communication apparatus that have the antenna matching circuit.

Description of the Related Art

In order to achieve impedance matching between a power feed circuit and an antenna, or, in particular, in order to cause a small antenna to have predetermined antenna characteristics over a broadband, an antenna matching circuit is connected to the antenna (Patent Documents 1 and 2).

Patent Document 1 describes that a variable resonant circuit is inserted between a feeding point of a radiating element and a ground conductor, and a matching frequency of an antenna is switched by changing a resonant frequency of the variable resonant circuit.

Patent Document 2 illustrates an antenna matching circuit including a series-parallel circuit constituted by a variable capacitance element and an inductor.

Patent Document 1: International Publication 2014/181569

Patent Document 2: Japanese Unexamined Patent Application Publication (Translation of PCT Application) No. 2012-505580

BRIEF SUMMARY OF THE DISCLOSURE

As the frequency band for cellular phones have become broader in recent years, antenna characteristics for the broader band are also required. However, a cellular phone terminal has a limited space in which an antenna may be mounted, and in particular a low frequency band (low band) antenna needs to be miniaturized and then achieve broadband. Since wavelengths are longer in a low frequency band than in a high frequency band, the low frequency band antenna seems smaller in volume than the high frequency band antenna even when the low and high frequency band antennas have the same antenna volume. Thus, the low frequency band antenna needs to be more miniaturized than the high frequency band antenna. As means for performing miniaturization and then achieving broadband, a circuit for switching matching frequencies of the antenna is generally provided.

Note that, in this case, achievement of broadband means that some matching states are provided for covering a necessary band.

However, with the configuration illustrated in Patent Document 1, the matching frequencies of the antenna are switched by changing the capacitance of the variable capacitance element or by switching capacitance elements having different capacitances using a switch. Thus, there is a problem in that the range of impedance for achieving matching is limited.

In addition, with the configuration illustrated in Patent Document 2, the matching frequencies of an antenna are switched by changing the capacitances of two variable capacitance elements, that is, the circuit configuration is fixed. Thus, there is a problem in that the range of impedance for achieving matching is limited.

The purpose of the present disclosure is to provide an antenna matching circuit that enables impedance matching over a wide frequency band without increasing the complexity of the circuit, and an antenna circuit, a front-end circuit, and a communication apparatus that have the antenna matching circuit.

(1) An antenna matching circuit according to the present disclosure includes a first circuit that is connected between a power feed port and an antenna port, and a second circuit that is connected between the power feed port and the ground or between the antenna port and the ground, and the antenna matching circuit is characterized by including a switch that performs switching at least between a first state in which a second end of the second circuit is connected to a first end of the first circuit and a second state in which the second end of the second circuit is connected to a second end of the first circuit, the first end of the first circuit being connected to the power feed port, the second end of the first circuit being connected to the antenna port, a first end of the second circuit being connected to the ground.

With the above-described configuration, impedance matching may be achieved over a broadband with a small number of elements.

(2) In (1) described above, preferably, the first circuit is a circuit in which a first variable capacitance element is connected in series with a first inductor, and the second circuit is a circuit in which a second variable capacitance element is connected in parallel with a second inductor. As a result, impedance matching may be achieved over a broadband even with a small number of elements.

(3) In (1) or (2) described above, preferably, in a case where the impedance of an antenna connected to the antenna port is expressed using a reflection coefficient, the switch performs switching to the first state in a case where the real part of the reflection coefficient is negative, and the switch performs switching to the second state in a case where the real part of the reflection coefficient is positive. As a result, impedance matching may be achieved with a small amount of impedance displacement on a Smith chart.

(4) In any of (1) to (3) described above, preferably, the first variable capacitance element, the second variable capacitance element, and the switch are included in a single IC. As a result, the number of components to be mounted on a circuit board or the like is reduced. In addition, circuit integration becomes easier by providing the first inductor and the second inductor outside the IC.

(5) The antenna circuit according to the present disclosure includes the antenna matching circuit described in any one of (1) to (4) described above, and a first antenna that is connected to the antenna port and that is for a first communication frequency band.

With the above-described configuration, the antenna circuit may be configured that achieves impedance matching over a broadband with a small number of elements.

(6) In (5) described above, preferably, the antenna circuit further includes a second antenna for a second communication frequency band that is a higher frequency band than the first communication frequency band using the first antenna, and a second power feed circuit that is connected to the second antenna and that is for the second communication frequency band, and a low pass filter whose cutoff frequency is between the first communication frequency band and the second communication frequency band is provided at the antenna port. This may suppress emission of unnecessary waves such as a harmonic that has occurred in the variable capacitance element or the switch from the first antenna, and suppress desensitization caused due to the unnecessary waves reaching the second antenna.

(7) In (6) described above, preferably, the low pass filter has an impedance transformation function for the first antenna and the antenna matching circuit. Normally, the antenna is made small for reasons of limited mounting space, and thus the impedance of the antenna is often displaced from a standard impedance (50 Ω). The low pass filter is for example configured in which a series inductor and a parallel capacitor are connected in a ladder form and may perform input-output impedance transformation. Thus, the amount of impedance displacement by the antenna matching circuit is reduced by bringing the impedance of the low pass filter close to the impedance of the antenna, and the efficiency of the entire antenna circuit may be improved.

(8) In (6) or (7) described above, preferably, a high pass filter whose cutoff frequency is between the first communication frequency band and the second communication frequency band is provided between the second power feed circuit and the second antenna. As a result, even when a fundamental emitted from the first antenna (low band antenna) reaches the second antenna (mid/high band antenna), the fundamental is reflected by the high pass filter and emitted again, and thus a decrease in efficiency may be prevented.

(9) In (8) described above, preferably, the high pass filter has an impedance transformation function for the second antenna and the second power feed circuit. As a result, the high pass filter is for example configured in which a series capacitor and a parallel inductor are connected in a ladder form and may perform input-output impedance transformation. Thus, the amount of impedance displacement by the antenna matching circuit is reduced by bringing the impedance of the high pass filter close to the impedance of the antenna, and the efficiency of the entire antenna circuit may be improved.

(10) An antenna circuit according to the present disclosure includes
a diplexer having a low pass filter between a first port and a third port, and a high pass filter between a second port and the third port,
an antenna that is connected to the third port of the diplexer,
a first power feed circuit that feeds power to the antenna via the first port of the diplexer, and
a second power feed circuit that feeds power to the antenna via the second port of the diplexer, and
the antenna circuit is characterized in that the antenna matching circuit according to any one of (1) to (4) described above is provided between the first power feed circuit and the first port of the diplexer.

With the above-described configuration, an antenna circuit that is usable over a wide band may be configured with a small number of elements in a configuration for feeding power to an antenna from one power feed unit.

(11) In (10) described above, preferably, the low pass filter has an impedance transformation function for the antenna and the antenna matching circuit, or the high pass filter has an impedance transformation function for the antenna and the antenna matching circuit. As a result, the amount of impedance displacement by the antenna matching circuit is reduced by bringing either or both of the impedance of the low pass filter and that of the high pass filter close to the impedance of the antenna, and the efficiency of the entire antenna circuit may be improved.

(12) A front-end circuit according to the present disclosure includes
the antenna matching circuit according to any one of (1) to (4) described above, and a high-frequency circuit that is connected to the antenna matching circuit.

With the above-described configuration, the number of components is reduced. In addition, the front-end circuit may be used as a very versatile module component by including the antenna matching circuit dealing with a wide range of change in the impedance of the antenna.

(13) In (12) described above, the high-frequency circuit may include a power amplifier that performs power amplification on a transmission signal.

(14) A communication apparatus according to the present disclosure includes the antenna circuit according to any one of (5) to (11) described above, and a communication circuit that is connected to the antenna circuit. As a result, a small communication apparatus is configured with the antenna circuit configured in a limited space.

According to the present disclosure, an antenna matching circuit that enables impedance matching over a wide frequency band without increasing the complexity of the circuit, and an antenna circuit, a front-end circuit, and a communication apparatus that have the antenna matching circuit may be obtained.

BRIEF DESCRIPTION OF THE SEVERAL VIEWS OF THE DRAWINGS

FIG. 13 is a diagram illustrating optimal values of elements of units of an antenna matching circuit 101 in bands of a low band.

FIG. 17 is a diagram illustrating values of elements of units of the low pass filter 51 and the high pass filter 52 of the antenna matching circuit according to the sixth embodiment.

DETAILED DESCRIPTION OF THE DISCLOSURE

Figure 1:
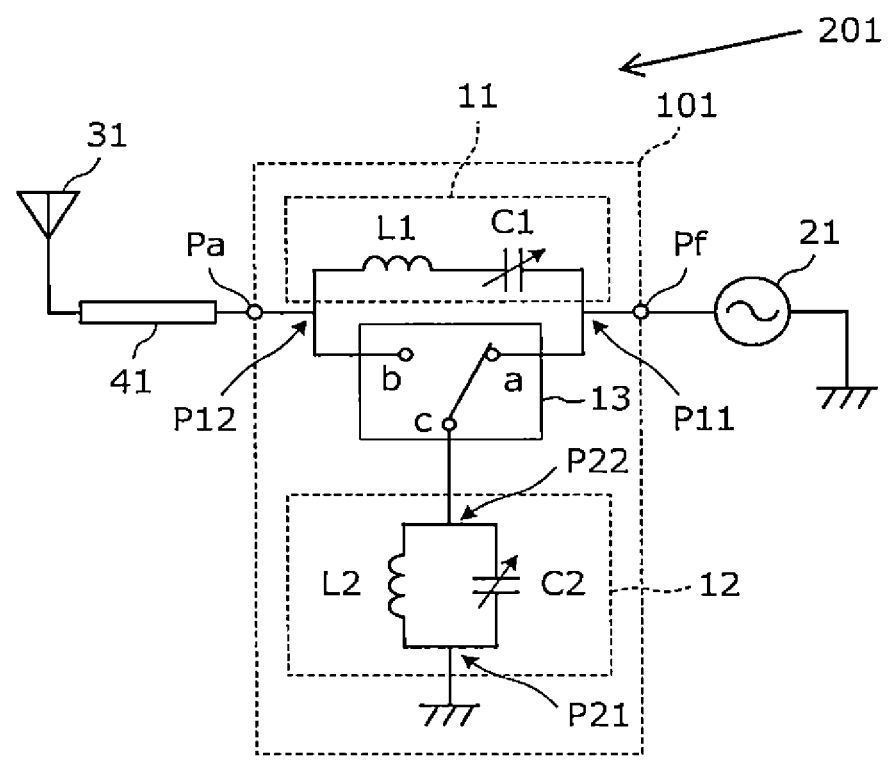
FIG. 1 is a circuit diagram of an antenna circuit 201 according to a first embodiment.

In the following, a plurality of embodiments for executing the present disclosure will be illustrated by giving some specific examples with reference to the drawings. Elements at the same position are denoted by the same reference numeral in the drawings. By considering description or the ease of understanding of main points, the embodiments are separately illustrated for the sake of convenience; however, the configurations illustrated in different embodiments may be partially replaced or combined. In second and subsequent embodiments, description of things common to a first embodiment will be omitted, and only differences will be described. In particular, substantially the same effects caused by substantially the same configuration will not be mentioned at each embodiment.

<<First Embodiment>>

FIG. 1 is a circuit diagram of an antenna circuit 201 according to the first embodiment. The antenna circuit 201 includes an antenna matching circuit (antenna tuner) 101, a power feed circuit 21, a transmission line 41, and an antenna 31.

The antenna matching circuit 101 includes a first circuit 11 that is connected in series between a power feed port Pf and an antenna port Pa, a second circuit 12 that is connected in parallel between the power feed port Pf and the ground or between the antenna port Pa and the ground, and a switch 13.

The first circuit 11 is a circuit in which a first variable capacitance element C1 is connected in series with a first inductor L1. The second circuit 12 is a circuit in which a second variable capacitance element C2 is connected in parallel with a second inductor L2.

A first end P11 of the first circuit 11 is connected to the power feed port Pf, and a second end P12 of the first circuit 11 is connected to the antenna port Pa. A first end P21 of the second circuit 12 is connected to the ground.

The switch 13 performs switching between a first state (c-a conducting state) in which a second end P22 of the second circuit 12 is connected to the first end P12 of the first circuit 11 and a second state (c-b conducting state) in which the second end P22 of the second circuit 12 is connected to the second end P12 of the first circuit 11.

Note that, in the case where no parallel resonant circuit is necessary for matching, there may be a state in which the above-described switch is completely OFF and c is connected to neither a nor b.

A control circuit is connected to the antenna matching circuit 101, and the control circuit supplies control signals to the variable capacitance elements C1 and C2 and a control signal to the switch 13.

Figure 2A:
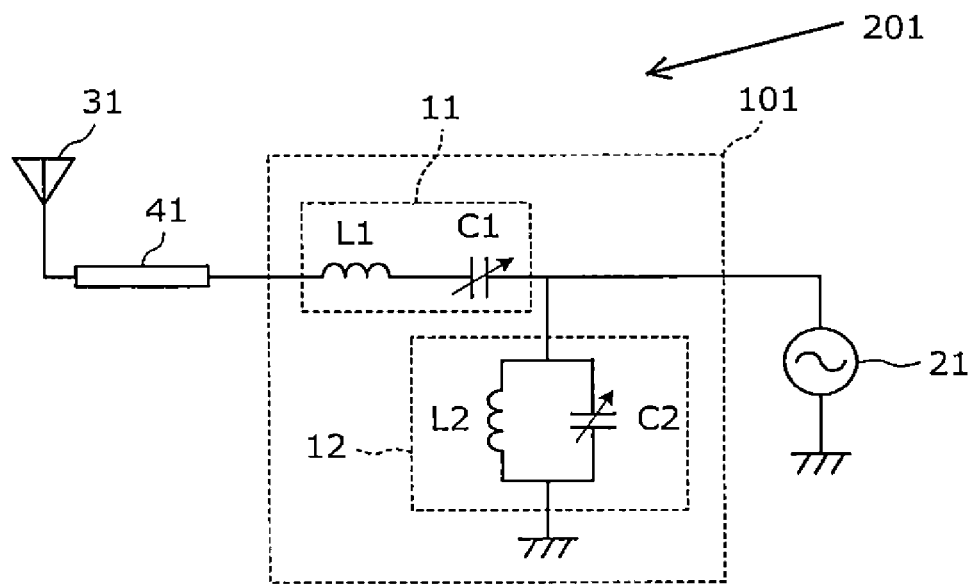
FIG. 2A is a circuit diagram of an antenna matching circuit 101 and the antenna circuit 201 in a first state.
Figure 2B:
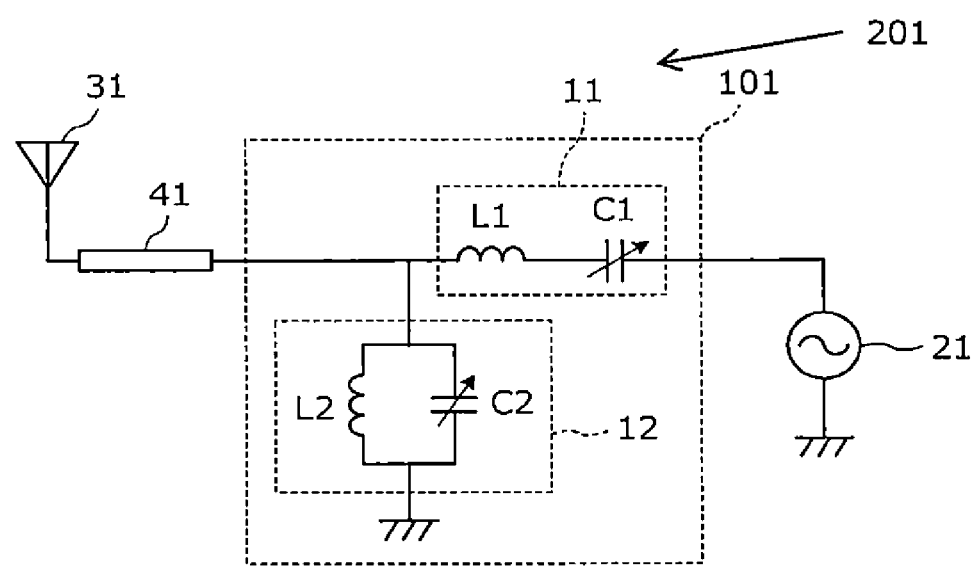
FIG. 2B is a circuit diagram of the antenna matching circuit 101 and the antenna circuit 201 in a second state.

FIG. 2A is a circuit diagram of the antenna matching circuit 101 and the antenna circuit 201 in the first state. FIG. 2B is a circuit diagram of the antenna matching circuit 101 and the antenna circuit 201 in the second state.

In either of the first state and the second state, the first circuit 11 is connected in series between the transmission line 41 and the power feed circuit 21. In the first state, when seen from the side where the antenna 31 is provided, the first circuit 11 is first connected in series with the transmission line 41, and the second circuit 12 is connected in parallel in a subsequent stage of the first circuit 11 as illustrated in FIG. 2A. In the second state, the second circuit 12 is first connected in parallel with the transmission line 41, and the first circuit 11 is connected in series in a subsequent stage of the second circuit 12 as illustrated in FIG. 2B.

Next, the effect of the antenna matching circuit 101 will be described with reference to FIG. 3A to FIG. 6B. FIGS. 3A and 3B, FIGS. 4A and 4B, FIGS. 5A and 5B, and FIGS. 6A and 6B are each a diagram illustrating the configuration of an antenna matching circuit and the effect of impedance matching due to the configuration. FIGS. 3A and 3B and FIGS. 4A and 4B correspond to the first state of the switch 13, and FIGS. 5A and 5B and FIGS. 6A and 6B correspond to the second state of the switch 13.

Figure 3A:
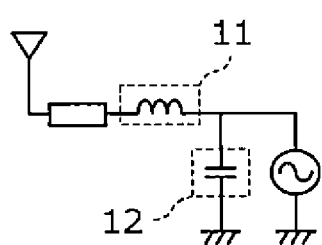
FIGS. 3A and 3B are diagrams illustrating the configuration of an antenna matching circuit and the effect of impedance matching due to the configuration.
Figure 3A:
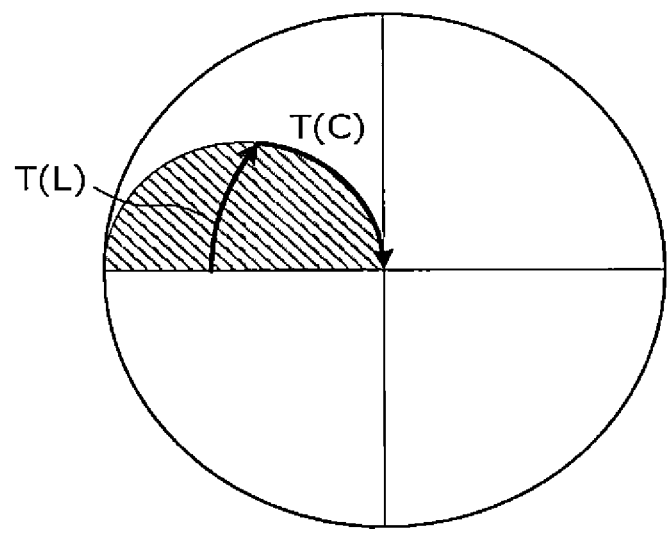

In the case where the impedance of the antenna 31 is illustrated on a Smith chart and is in a hatched area of FIG. 3A, the first circuit 11 is treated as an inductive reactance and the second circuit 12 is treated as a capacitive reactance as illustrated in FIG. 3A. Matching is achieved first through displacement (locus T(L)) in a direction in which the impedance of the antenna is inductively improved in the first circuit 11 and through displacement (locus T(C)) to a specified impedance (50 Ω) in the second circuit 12.

Figure 3B:
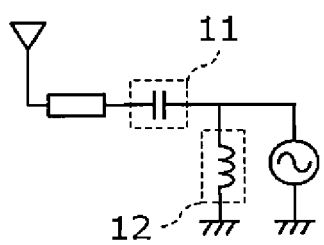
Figure 3B:
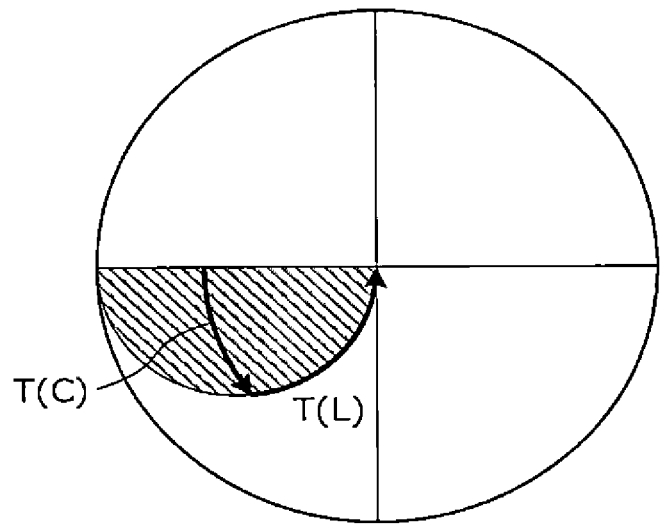

In the case where the impedance of the antenna 31 is illustrated on a Smith chart and is in a hatched area of FIG. 3B, the first circuit 11 is treated as a capacitive reactance and the second circuit 12 is treated as an inductive reactance as illustrated in FIG. 3B. Matching is achieved first through displacement (locus T(C)) in a direction in which the impedance of the antenna is capacitively improved in the first circuit 11 and through displacement (locus T(L)) to a specified impedance (50 Ω) in the second circuit 12.

Figure 4A:
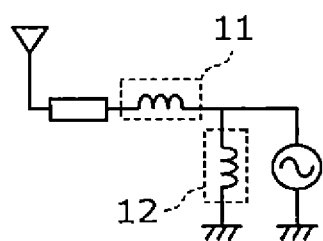
FIGS. 4A and 4B are diagrams illustrating the configuration of an antenna matching circuit and the effect of impedance matching due to the configuration.
Figure 4A:
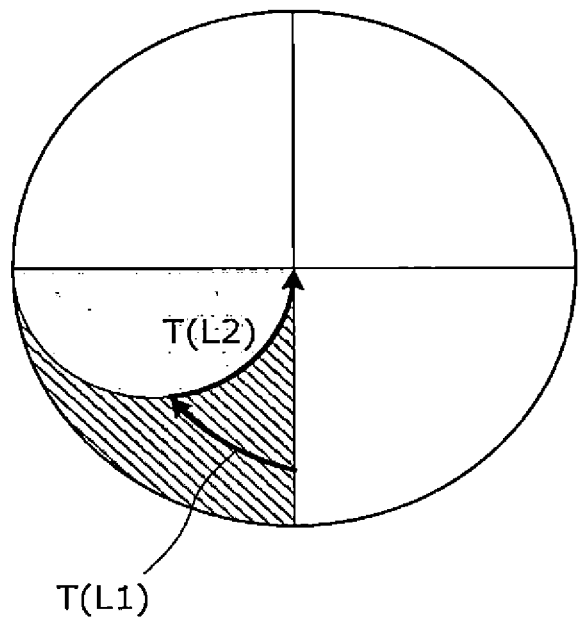

In the case where the impedance of the antenna 31 is illustrated on a Smith chart and is in a hatched area of FIG. 4A, both the first circuit 11 and the second circuit 12 are treated as an inductive reactance as illustrated in FIG. 4A. Matching is achieved first through displacement (locus T(L1)) in a direction in which the impedance of the antenna is inductively improved in the first circuit 11 and through displacement (locus T(L2)) to a specified impedance (50 Ω) in the second circuit 12.

Figure 4B:
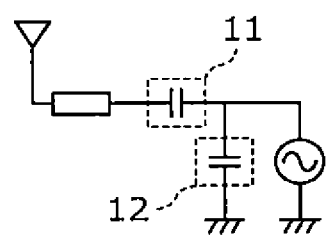
Figure 4B:
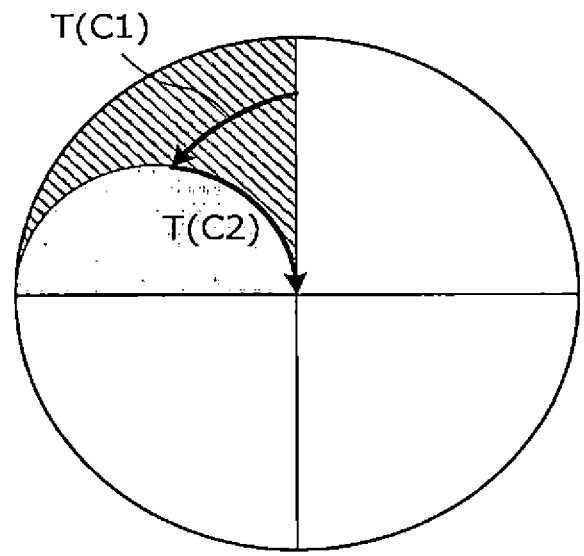

In the case where the impedance of the antenna 31 is illustrated on a Smith chart and is in a hatched area of FIG. 4B, both the first circuit 11 and the second circuit 12 are treated as a capacitive reactance as illustrated in FIG. 4B. Matching is achieved first through displacement (locus T(C1)) in a direction in which the impedance of the antenna is capacitively improved in the first circuit 11 and through displacement (locus T(C2)) to a specified impedance (50 Ω) in the second circuit 12.

Figure 5A:
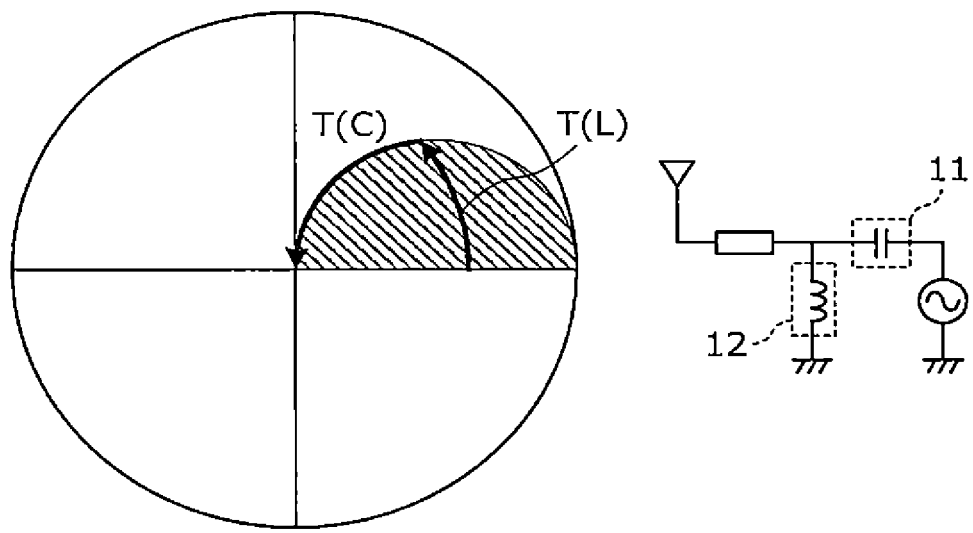
FIGS. 5A and 5B are diagrams illustrating the configuration of an antenna matching circuit and the effect of impedance matching due to the configuration.

In the case where the impedance of the antenna 31 is illustrated on a Smith chart and is in a hatched area of FIG. 5A, the second circuit 12 is treated as an inductive reactance and the first circuit 11 is treated as a capacitive reactance as illustrated in FIG. 5A. Matching is achieved first through displacement (locus T(L)) in a direction in which the impedance of the antenna is inductively improved in the second circuit 12 and through displacement (locus T(C)) to a specified impedance (50 Ω) in the second circuit 12.

Figure 5B:
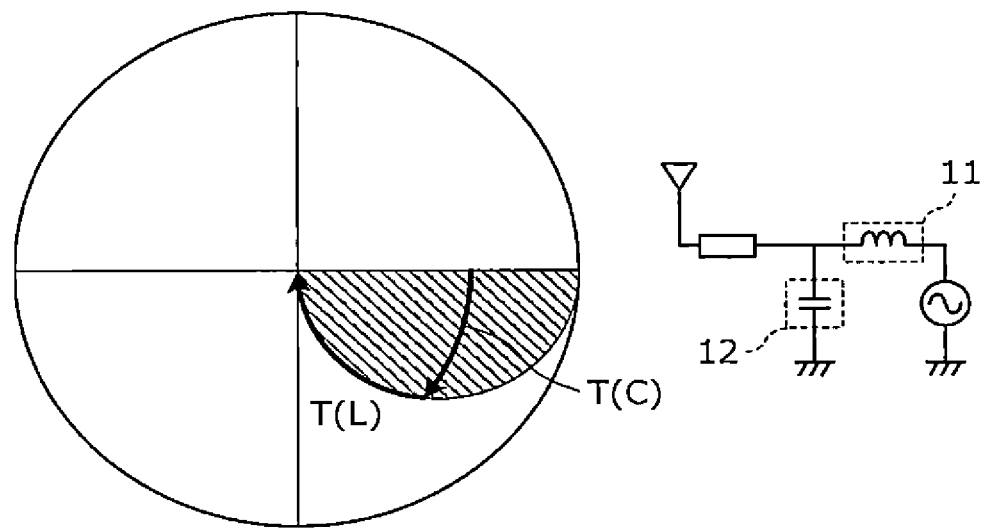

In the case where the impedance of the antenna 31 is illustrated on a Smith chart and is in a hatched area of FIG. 5B, the second circuit 12 is treated as a capacitive reactance and the first circuit 11 is treated as an inductive reactance as illustrated in FIG. 5B. Matching is achieved first through displacement (locus T(C)) in a direction in which the impedance of the antenna is capacitively improved in the second circuit 12 and through displacement (locus T(L)) to a specified impedance (50 Ω) in the second circuit 12.

Figure 6A:
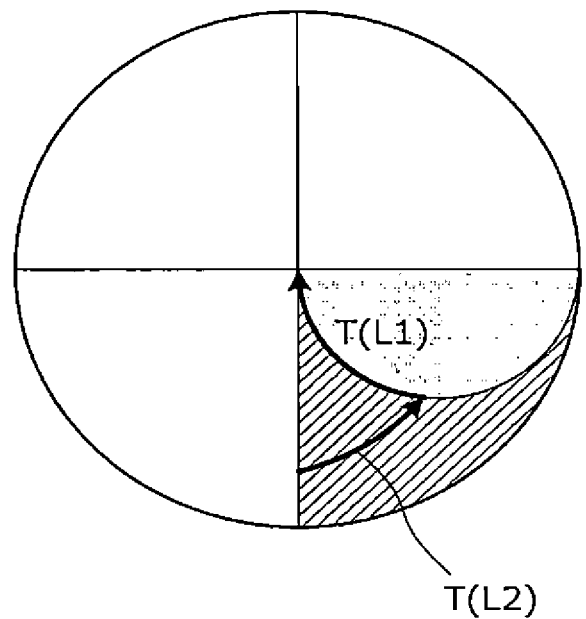
FIGS. 6A and 6B are diagrams illustrating the configuration of an antenna matching circuit and the effect of impedance matching due to the configuration.

In the case where the impedance of the antenna 31 is illustrated on a Smith chart and is in a hatched area of FIG. 6A, both the first circuit 11 and the second circuit 12 are treated as an inductive reactance as illustrated in FIG. 6A. Matching is achieved first through displacement (locus T(L2)) in a direction in which the impedance of the antenna is inductively improved in the second circuit 12 and through displacement (locus T(L1)) to a specified impedance (50 Ω) in the first circuit 11.

Figure 6B:
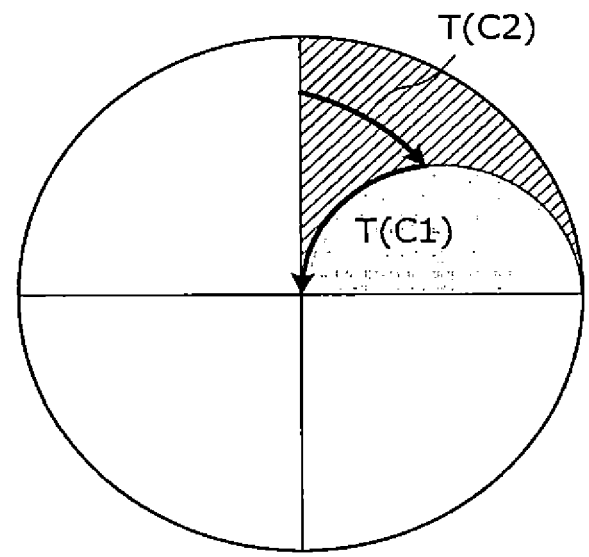

In the case where the impedance of the antenna 31 is illustrated on a Smith chart and is in a hatched area of FIG. 6B, both the first circuit 11 and the second circuit 12 are treated as a capacitive reactance as illustrated in FIG. 6B. Matching is achieved first through displacement (locus T(C2)) in a direction in which the impedance of the antenna is capacitively improved in the second circuit 12 and through displacement (locus T(C1)) to a specified impedance (50 Ω) in the first circuit 11.

The amount of impedance displacement by the first circuit 11 is determined on the basis of the first variable capacitance element C1 and the first inductor L1. The reactance of the first circuit 11 may be set in the range from inductive to capacitive by determining as appropriate the minimum and maximum values of the capacitance of the first variable capacitance element C1 and the inductance of the first inductor L1. Note that it is nonessential that the reactance of the first circuit 11 is settable in the range from inductive to capacitive. Although the range of impedance matching becomes narrower, the reactance of the first circuit 11 may be set in the inductive range or in the capacitive range.

The amount of impedance displacement by the second circuit 12 is determined on the basis of the second variable capacitance element C2 and the second inductor L2. The reactance of the second circuit 12 may be set in the range from inductive to capacitive by determining as appropriate the minimum and maximum values of the capacitance of the second variable capacitance element C2 and the inductance of the second inductor L2. It is also nonessential that the reactance of the second circuit 12 is settable in the range from inductive to capacitive. Although the range of impedance matching becomes narrower, the reactance of the second circuit 12 may be set in the inductive range or the capacitive range.

As described above, in the case where the impedance of the antenna is expressed using a reflection coefficient and the real part of the reflection coefficient is negative, the switch 13 is caused to enter the first state as illustrated in FIGS. 3A and 3B and FIGS. 4A and 4B. In contrast, in the case where the impedance of the antenna is expressed using a reflection coefficient and the real part of the reflection coefficient is positive, the switch 13 is caused to enter the second state as illustrated in FIGS. 5A and 5B and FIGS. 6A and 6B. As a result, impedance matching is achieved with a small impedance matching amount.

According to the present embodiment, circuits (the first circuit 11, the second circuit 12, and the switch 13) having a small number of elements make it possible to achieve impedance matching over a wide range.

Note that the present embodiment (also embodiments to be described later) illustrates the example in which the antenna is fed with power through the transmission line, but this transmission line is nonessential.

<<Second Embodiment>>

In the second embodiment, an antenna circuit 202 is illustrated that includes two antennas and two power feed circuits.

Figure 7:
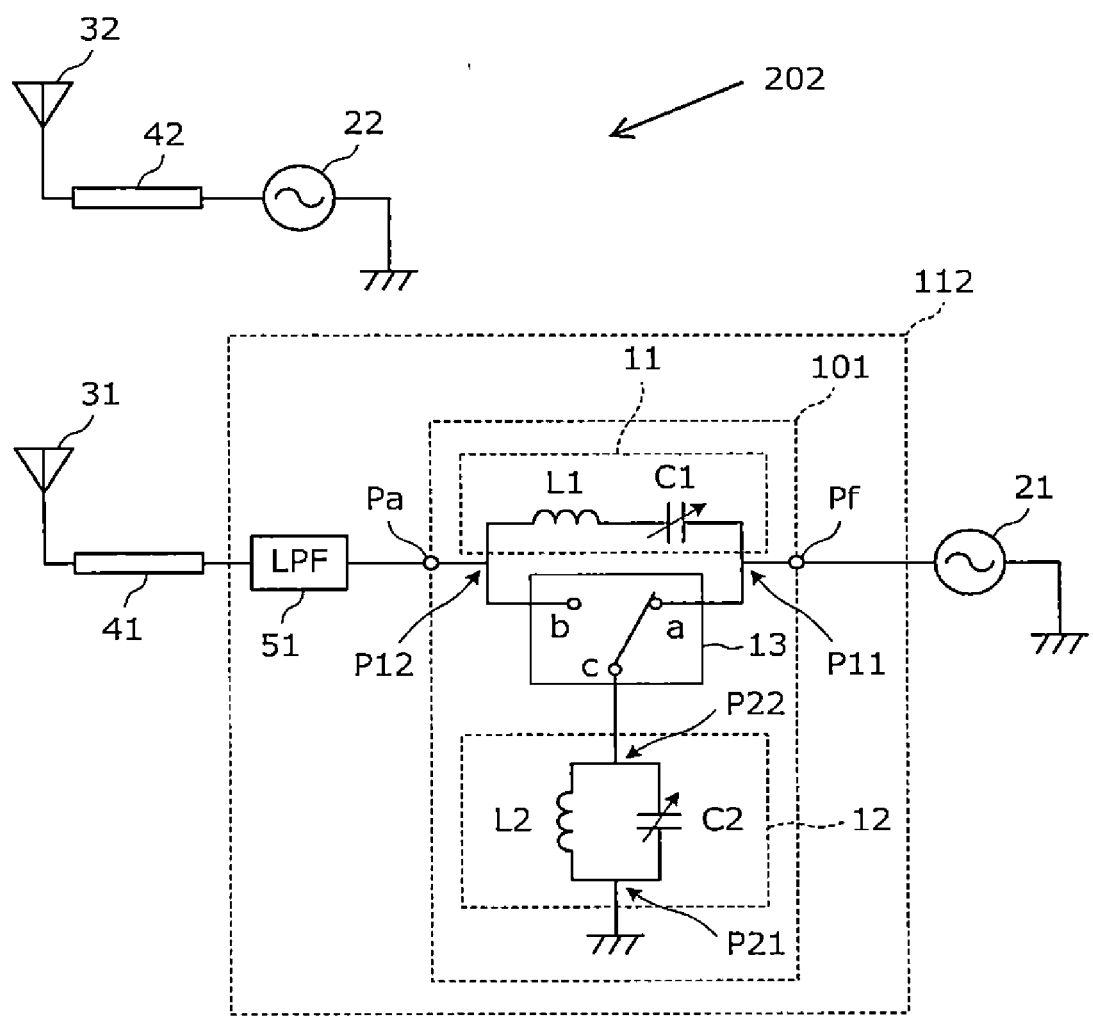
FIG. 7 is a circuit diagram of an antenna circuit 202 according to a second embodiment.

FIG. 7 is a circuit diagram of the antenna circuit 202 according to the second embodiment. The antenna circuit 202 includes a low band antenna circuit and a mid/high band antenna circuit. The mid/high band antenna circuit includes a second power feed circuit 22, a second transmission line 42, and a second antenna 32. The low band antenna circuit includes an antenna matching circuit 101, a first power feed circuit 21, a low pass filter 51, a first transmission line 41, and a first antenna 31. The low pass filter 51 is inserted between the antenna matching circuit and the first transmission line 41, that is, on the antenna side with respect to the antenna matching circuit 101. The antenna matching circuit 101 and the low pass filter 51 are configured as one antenna matching circuit module 112.

Here, a low band is an example of "first communication frequency band", which is 699 MHz to 960 MHz, according to the present disclosure, and a mid/high band is an example of "second communication frequency band", which is 1710 MHz to 2690 MHz, according to the present disclosure.

The cutoff frequency of the low pass filter 51 is between the low band and the mid/high band. That is, the low pass filter 51 allows a low band signal to pass therethrough and blocks a mid/high band signal. This suppresses emission of unnecessary waves such as a harmonic that has occurred in a variable capacitance element C1 or C2 or a switch 13 within the antenna matching circuit 101 from the first antenna 31, and suppresses desensitization caused by the unnecessary waves reaching the second antenna 32.

In addition, a mid/high band transmission wave emitted from the second antenna 32 is prevented from reaching the antenna matching circuit 101 from the first antenna 31 at the time of 2 up link using the low band and the mid/high band in a carrier aggregation operation, and the occurrence of intermodulation distortion (IMD) due to mixing of a low band transmission wave and the mid/high band transmission wave at the variable capacitance elements C1 and C2 and the switch 13 may be reduced.

Figure 8:
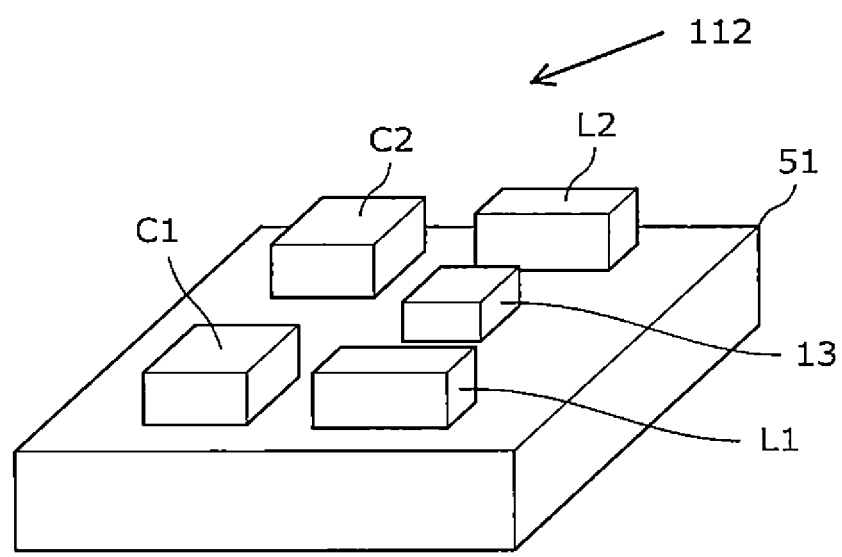
FIG. 8 is a perspective view of an antenna matching circuit module 112 illustrated in FIG. 7.

FIG. 8 is a perspective view of the antenna matching circuit module 112 illustrated in FIG. 7. The low pass filter 51 is formed by a resin multilayer substrate. The variable capacitance elements C1 and C2, inductors L1 and L2, and the switch 13 are mounted on the low pass filter 51 (resin multilayer substrate).

The variable capacitance elements C1 and C2 are semiconductor IC chips whose capacitances are determined under digital signal control. The switch 13 is a semiconductor IC chip for performing switching between the first state and the second state in accordance with a control signal. The inductors L1 and L2 are chip inductors formed by a resin multilayer substrate or a ceramic multilayer substrate.

A communication signal input-output terminal, a ground terminal, control signal input terminals for the variable capacitance elements C1 and C2, and a control signal input terminal for the switch 13 are formed on the bottom surface of the low pass filter 51 (resin multilayer substrate).

In this manner, the number of components to be mounted on a circuit board or the like is reduced by modularizing an antenna matching circuit and a filter.

<<Third Embodiment>>

In a third embodiment, an antenna circuit 203 is illustrated that includes two antennas and two power feed circuits.

Figure 9:
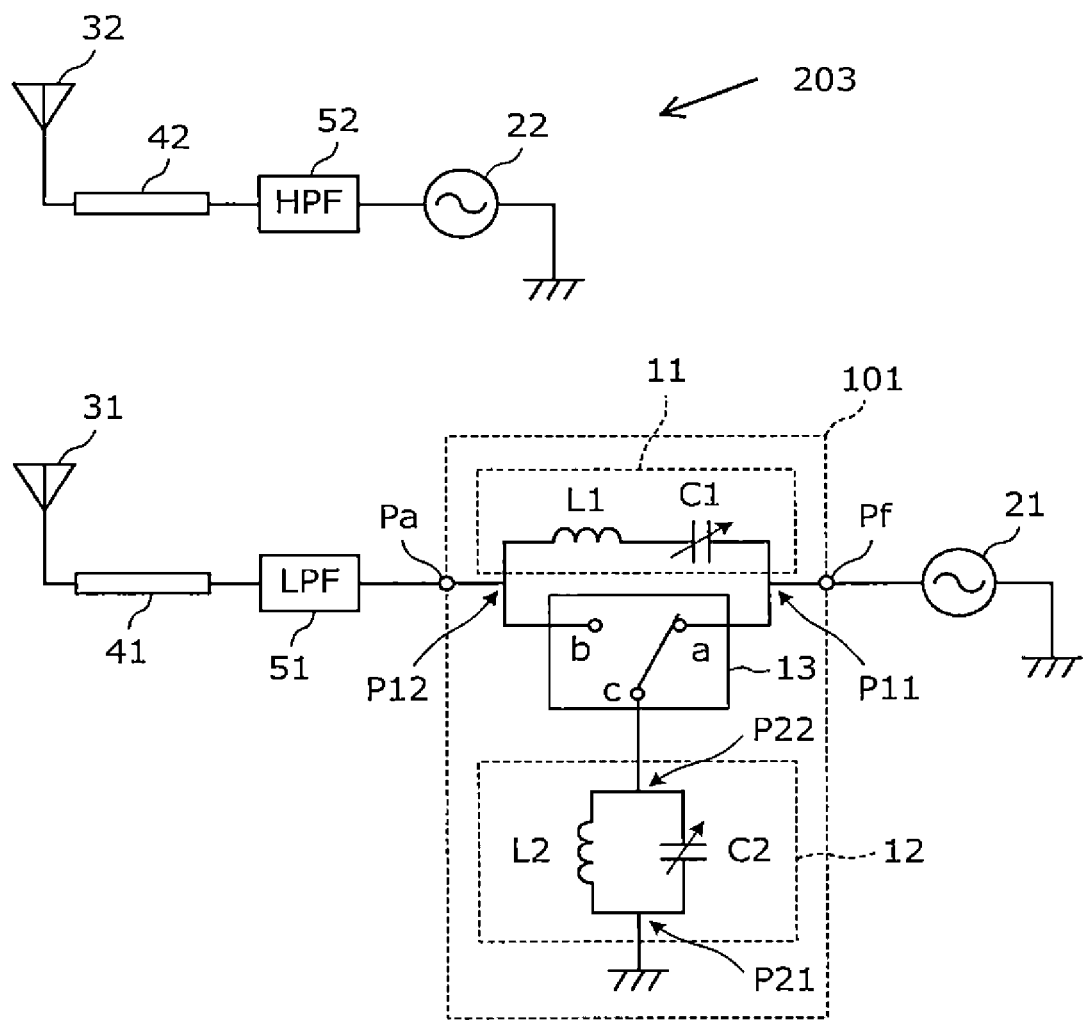
FIG. 9 is a circuit diagram of an antenna circuit 203 according to a third embodiment.

FIG. 9 is a circuit diagram of the antenna circuit 203 according to the third embodiment. The antenna circuit 203 includes a low band antenna circuit and a mid/high band antenna circuit. The mid/high band antenna circuit includes a second power feed circuit 22, a high pass filter 52, a second transmission line 42, and a second antenna 32. The low band antenna circuit includes an antenna matching circuit 101, a first power feed circuit 21, a low pass filter 51, a first transmission line 41, and a first antenna 31.

The cutoff frequency of the high pass filter 52 is between a low band and a mid/high band. That is, the high pass filter 52 allows a mid/high band signal to pass therethrough and blocks a low band signal. As a result, even when a transmission wave (fundamental) emitted from the first antenna (low band antenna) 31 reaches the second antenna (mid/high band antenna) 32, the signal is reflected by the high pass filter 52 and emitted again, and thus a decrease in efficiency may be prevented in the low band.

<<Fourth Embodiment>>

In a fourth embodiment, an antenna circuit 204 is illustrated that includes one antenna and two power feed circuits.

Figure 10:
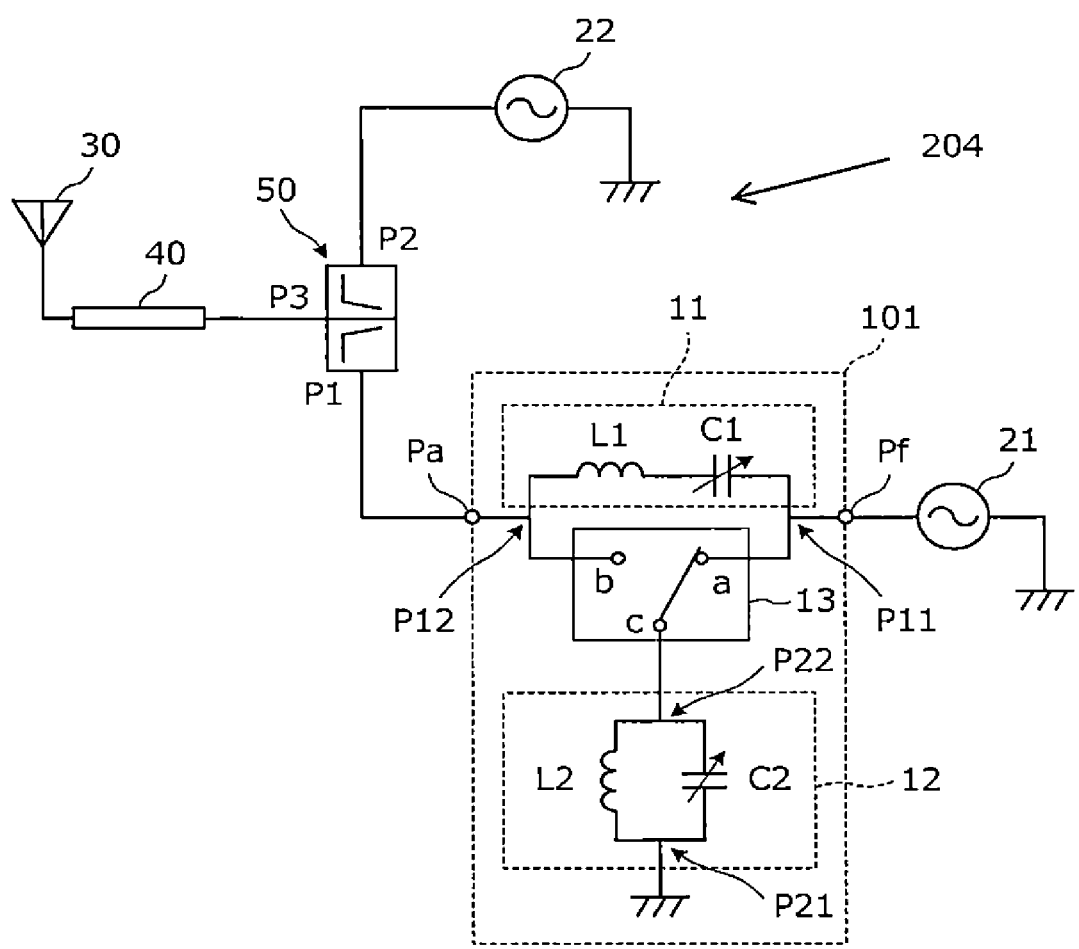
FIG. 10 is a circuit diagram of an antenna circuit 204 according to a fourth embodiment.

FIG. 10 is a circuit diagram of the antenna circuit 204 according to the fourth embodiment. The antenna circuit 204 includes a first power feed circuit 21, a second power feed circuit 22, a low band antenna circuit, a diplexer 50, a transmission line 40, and an antenna 30.

The configuration of the low band antenna circuit is the same as the configurations of the circuits according to the embodiments illustrated so far. The diplexer 50 has a low pass filter between a first port P1 and a third port P3, and a high pass filter between a second port P2 and the third port P3. The antenna 30 is connected to the third port of the diplexer 50 with the transmission line 40 interposed therebetween, an antenna matching circuit 101 for a low band is connected to the first port P1 of the diplexer, and the power feed circuit 22 for a mid/high band is connected to the second port P2.

The low pass filter of the diplexer 50 operates substantially the same as the low pass filter 51 illustrated in the second embodiment, and the high pass filter of the diplexer 50 operates substantially the same as the high pass filter 52 illustrated in the third embodiment.

According to the present embodiment, an antenna circuit that is usable over a broadband may be configured with a small number of elements in a configuration for feeding power to an antenna from one power feed unit.

<<Fifth Embodiment>>

In a fifth embodiment, an antenna circuit 205 is illustrated that includes one antenna and two power feed circuits. In addition, antenna efficiency simulation results will be illustrated in the present embodiment.

Figure 11:
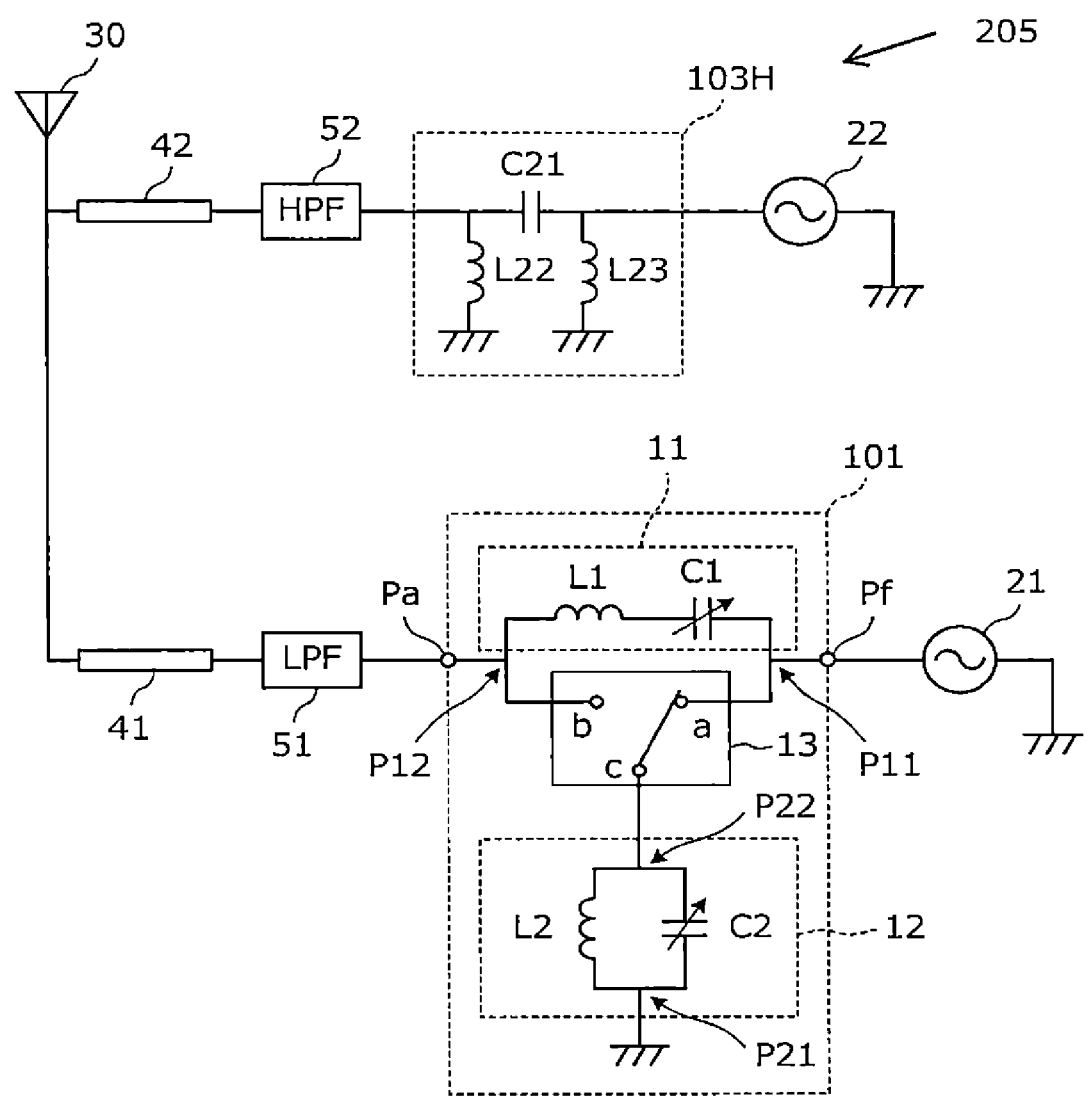
FIG. 11 is a circuit diagram of an antenna circuit 205 according to a fifth embodiment.

FIG. 11 is a circuit diagram of the antenna circuit 205 according to the fifth embodiment. The antenna circuit 205 includes a low band antenna circuit unit, a mid/high band antenna circuit unit, and an antenna 30. The mid/high band antenna circuit includes a second power feed circuit 22, an antenna matching circuit 103H, a high pass filter 52, and a second transmission line 42. The low band antenna circuit unit includes an antenna matching circuit 101, a first power feed circuit 21, a low pass filter 51, and a first transmission line 41.

Next, antenna efficiency simulation results of the antenna circuit 205 will be illustrated.

Figure 12:
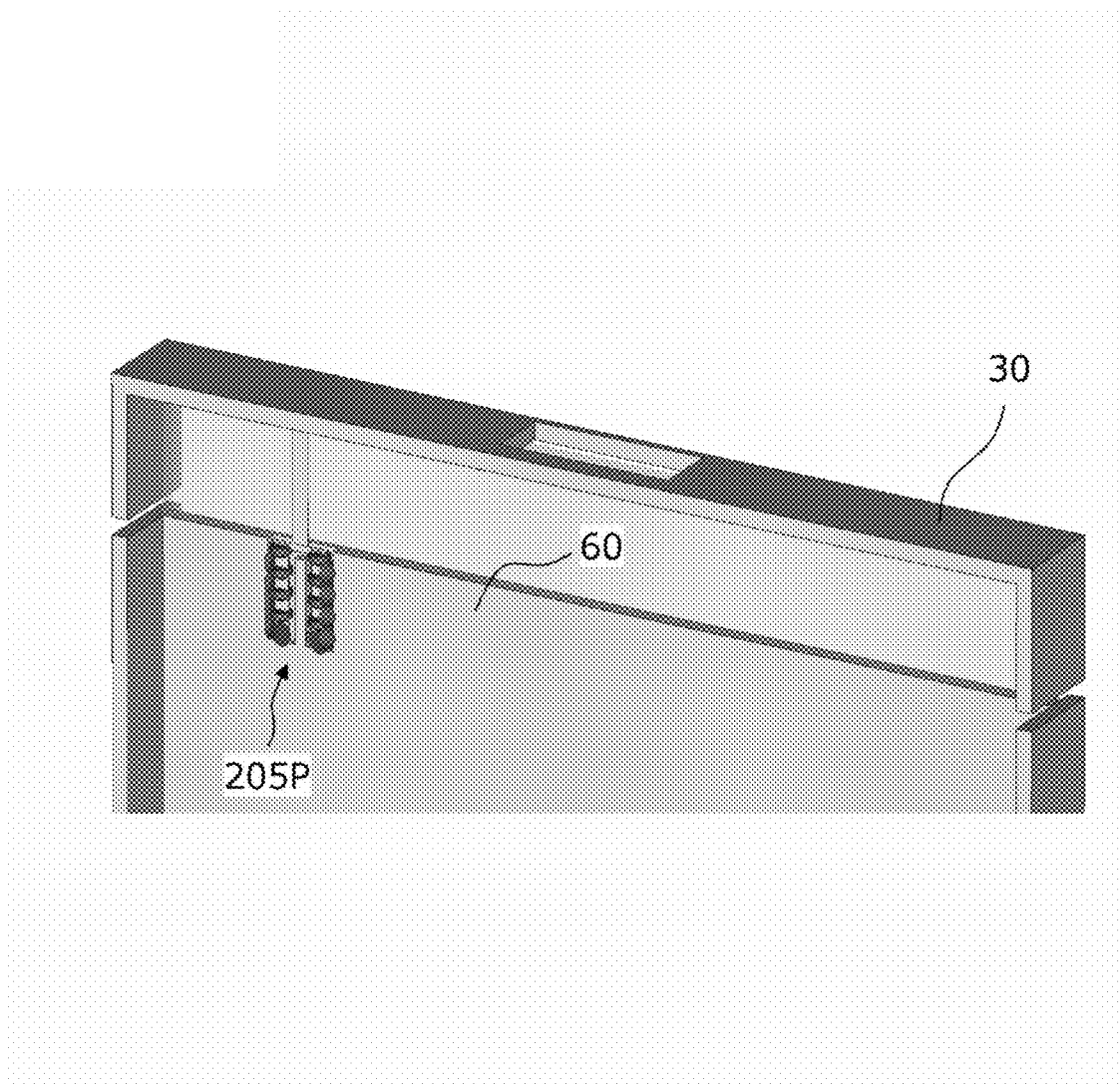
FIG. 12 is a diagram illustrating the configuration of an antenna 30 of a simulation model.

FIG. 12 is a diagram illustrating the configuration of an antenna 30 of a simulation model. The antenna 30 is a U-shaped metal body that is an end of a metal housing. A low band antenna circuit unit and a mid/high band antenna circuit unit are formed on a circuit board 60.

FIG. 13 is a diagram illustrating optimal values of elements of units of the antenna matching circuit 101 in bands of the low band. The switch 13 is in the second state (c-b conducting state).

Figure 14:
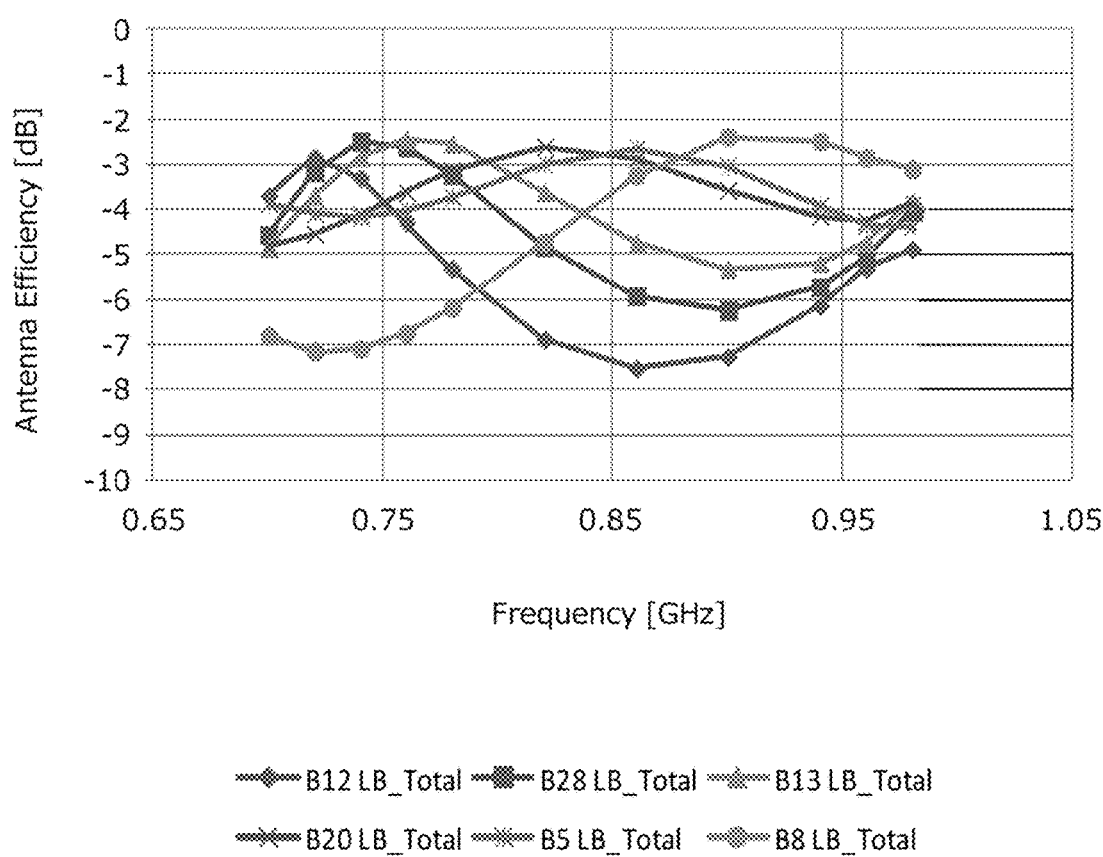
FIG. 14 is a diagram illustrating frequency characteristics of antenna efficiency in the low band.
Figure 15:
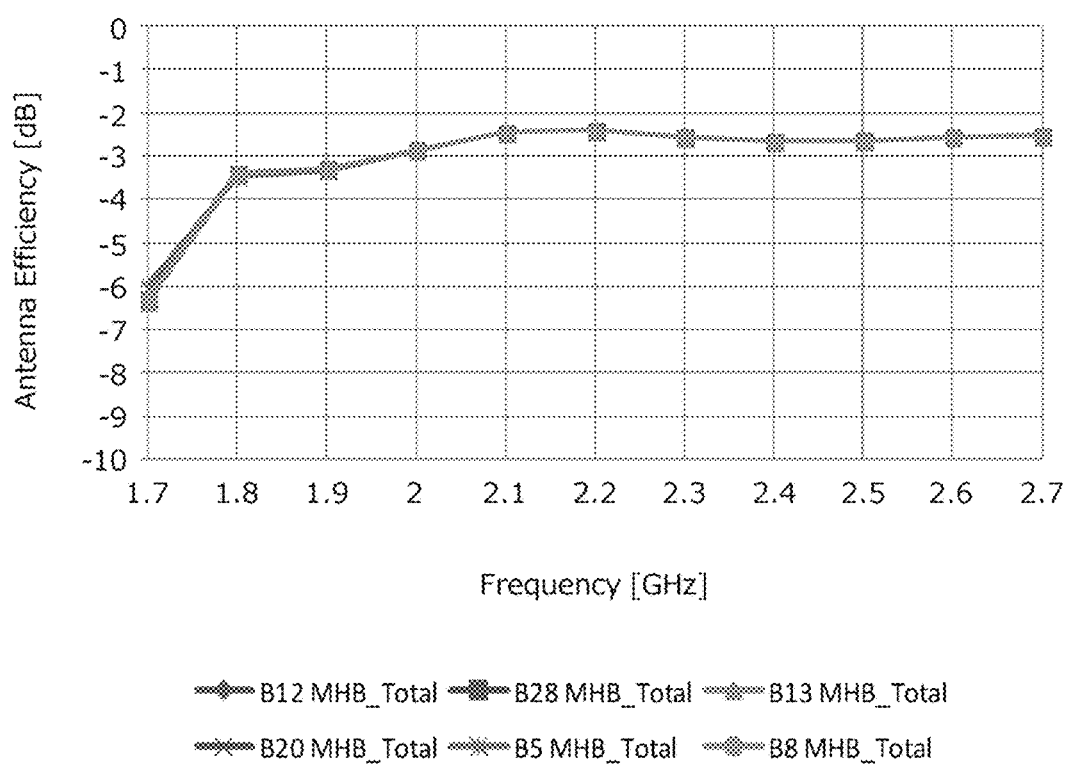
FIG. 15 is a diagram illustrating frequency characteristics of antenna efficiency in a mid/high band.

FIG. 14 is a diagram illustrating frequency characteristics of antenna efficiency in the low band, and FIG. 15 is a diagram illustrating frequency characteristics of antenna efficiency in the mid/high band. As illustrated in FIG. 14, arching curves are drawn for six respective bands in the low band. The peak values of the arching curves are about −2.5 dB, and high antenna efficiency is acquired for any of the bands. Since the antenna circuit 205 includes no matching circuit for the mid/high band, antenna efficiency barely depends on frequencies and high antenna efficiency is acquired as illustrated in FIG. 15.

<<Sixth Embodiment>>

In a sixth embodiment, the effect of impedance transformation of a low pass filter and a high pass filter provided in an antenna matching circuit will be illustrated.

Figure 16:
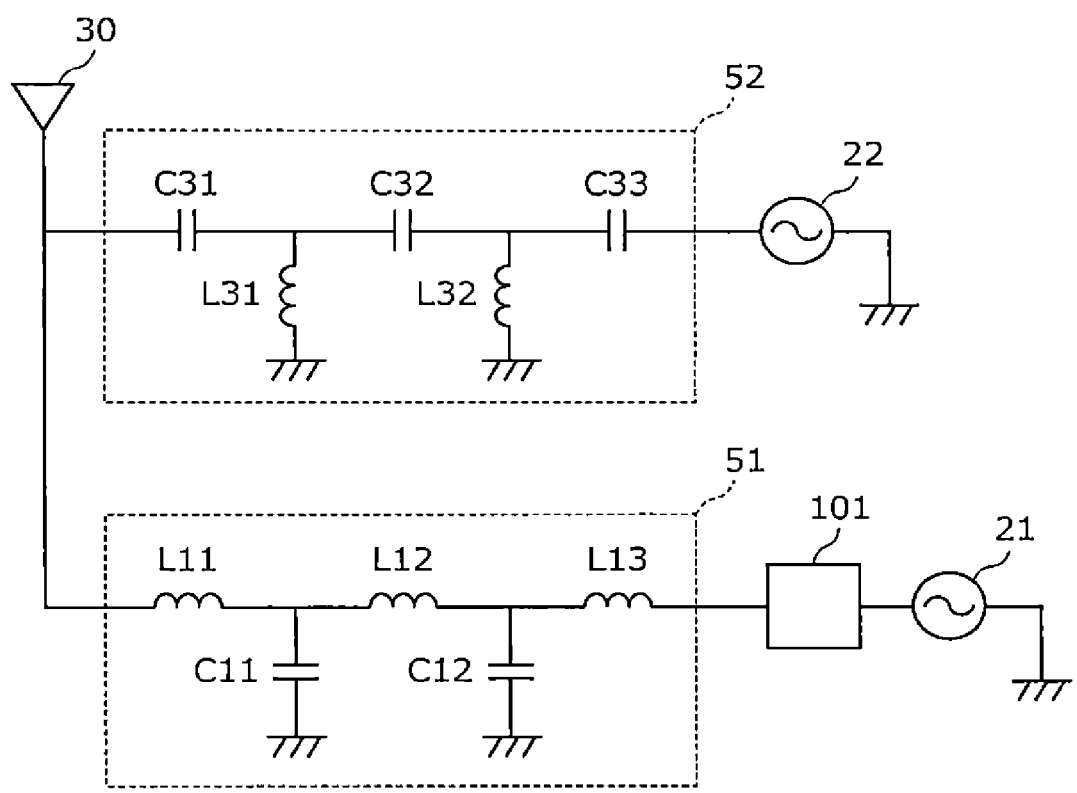
FIG. 16 is a circuit diagram of a low pass filter 51 and a high pass filter 52 of an antenna matching circuit according to a sixth embodiment.

FIG. 16 is a circuit diagram of a low pass filter 51 and a high pass filter 52 of an antenna matching circuit according to the sixth embodiment. The low pass filter 51 and the high pass filter 52 constitute a diplexer. The values of elements are as illustrated in FIG. 17. In FIG. 17, numerical values described in a field "impedance transformation" are impedance transformation values between the input and the output. For example, "LPF30-50" is a condition in the case where the input impedance of the low pass filter 51 is set to 30 Ω and the output impedance of the low pass filter 51 is set to 50 Ω. Since the impedance of an antenna 30 is about 50 Ω in a mid/high band, the high pass filter 52 of a mid/high band antenna matching circuit does not perform impedance transformation. The input impedance of the high pass filter 52 is 50 Ω and the output impedance of the high pass filter 52 is 50 Ω.

Figure 18:
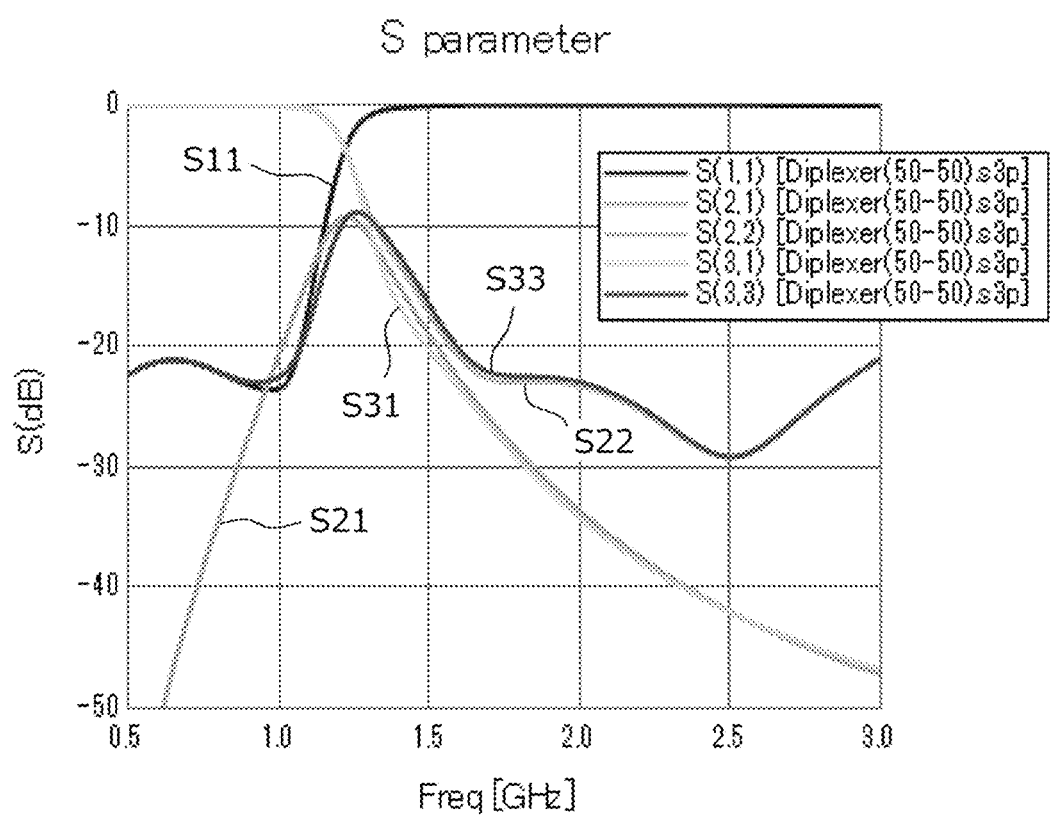
FIG. 18 is a diagram illustrating frequency characteristics of return loss and insertion loss of three ports of a diplexer according to the sixth embodiment.

FIG. 18 is a diagram illustrating frequency characteristics of return loss and insertion loss of three ports of the diplexer. In this case, a low pass filter side port is denoted as port 1, a high pass filter side port is denoted as port 2, and an antenna side port is denoted as port 3. Any of the characteristics is obtained when the input/output impedance is set to 50 Ω.

In this manner, the impedance of the antenna 30 whose impedance in a low band is lower than 50 Ω may be matched to 50Ω by the low pass filter 51 of a low band antenna circuit.

An example of impedance transformation using the low pass filter is described in the above-described example; however, impedance transformation may also be performed using a high pass filter of a mid/high band antenna circuit by setting values of elements.

In addition, use of the effect of impedance transformation of the low pass filter and the high pass filter may be applied to the diplexer 50 illustrated in FIG. 10.

<<Seventh Embodiment>>

In a seventh embodiment, an example will be illustrated in which a portion of an antenna matching circuit 101 is included in an IC.

Figure 19:
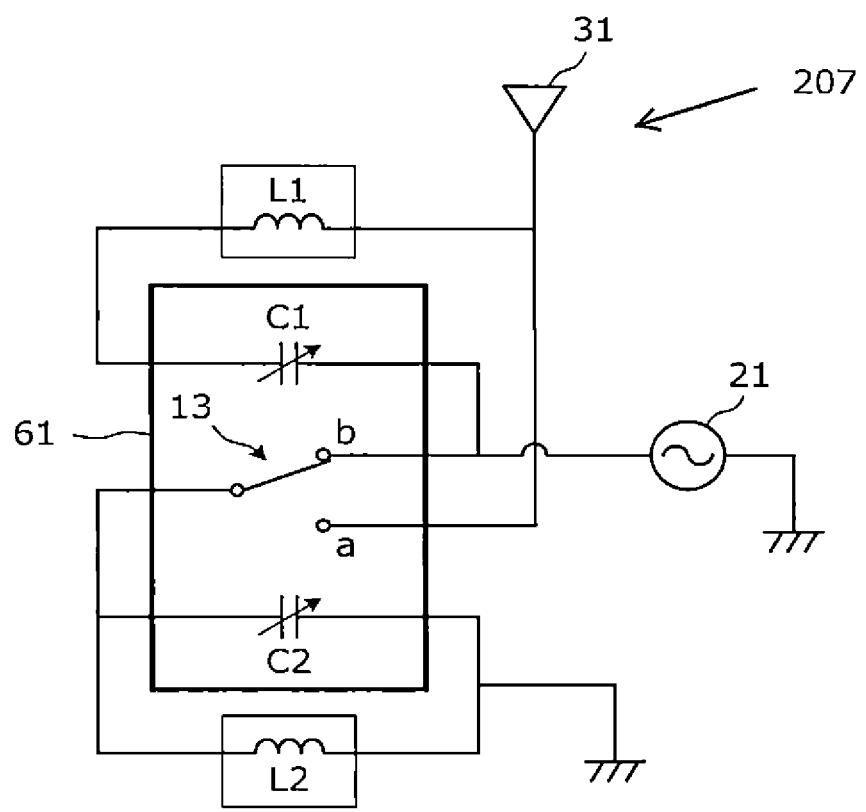
FIG. 19 is a circuit diagram of an antenna circuit 207 according to a seventh embodiment.

FIG. 19 is a circuit diagram of an antenna circuit 207 according to the seventh embodiment. A first variable capacitance element C1, a second variable capacitance element C2, and a switch 13 are included in a single IC 61. The IC 61, a first inductor L1, and a second inductor L2 constitute an antenna matching circuit. The effect of the antenna matching circuit is the same as that of the antenna matching circuit 101 illustrated in FIG. 1 in the first embodiment.

According to the present embodiment, the number of components to be mounted on a circuit board or the like is reduced. In addition, the IC 61 may be easily configured as a semiconductor integrated circuit by providing the first inductor L1 and the second inductor L2 outside the IC 61.

<<Eighth Embodiment>>

In an eighth embodiment, a communication apparatus will be illustrated.

Figure 20:
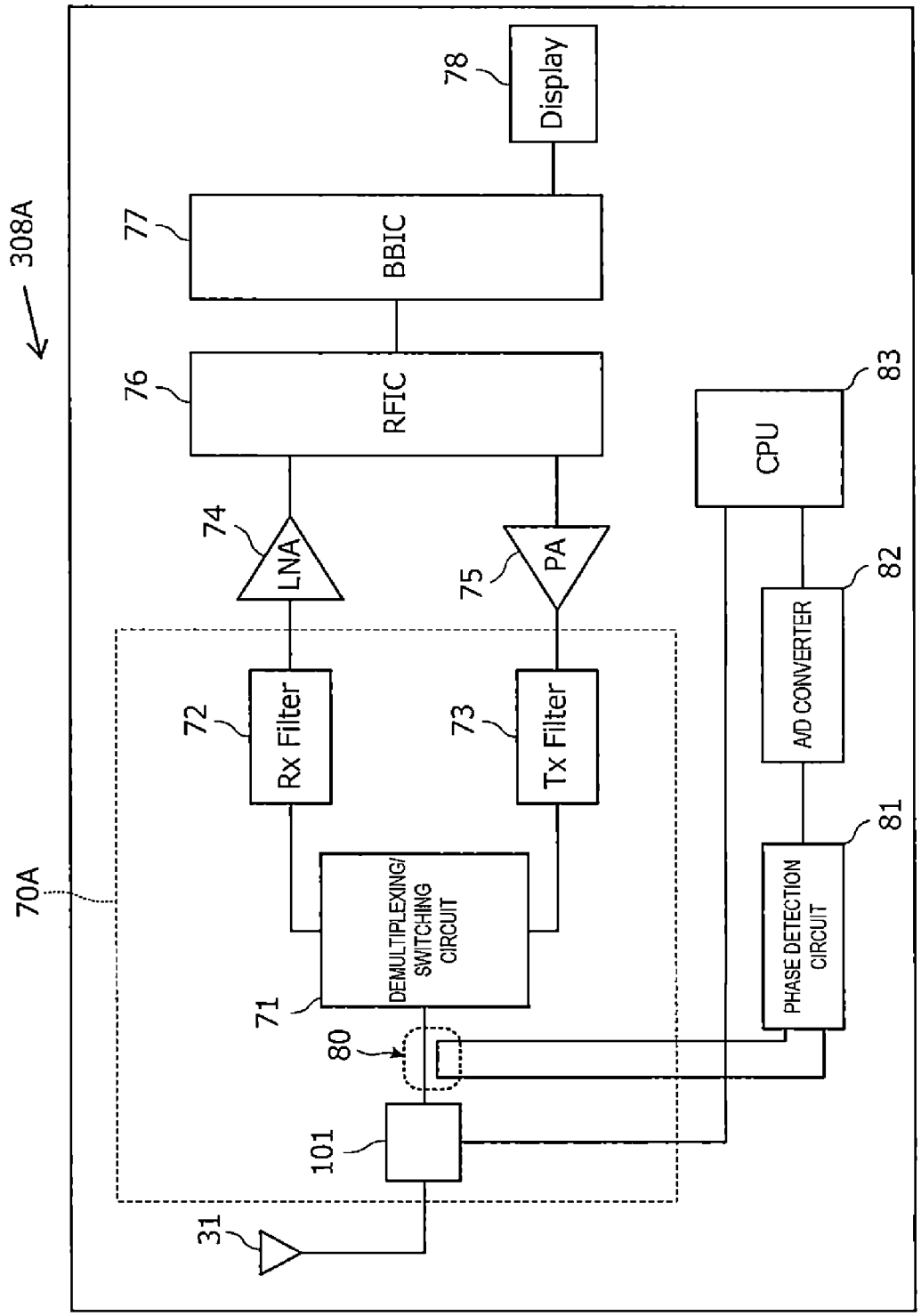
FIG. 20 is a block diagram of a communication apparatus 308A according to an eighth embodiment.

FIG. 20 is a block diagram of a communication apparatus 308A according to the eighth embodiment. The communication apparatus 308 is, for example, a cellular phone terminal. An antenna matching circuit 101 is connected to an antenna 31. A coupler 80 is provided between the antenna matching circuit 101 and a demultiplexing/switching circuit 71. The configuration of the antenna matching circuit 101 is the same as that illustrated in FIG. 1. A central processing unit (CPU) 83 is connected to the antenna matching circuit 101. The demultiplexing/switching circuit 71 is provided between the coupler 80 and a receiving filter 72 and between the coupler 80 and a transmitting filter 73. A low noise amplifier 74 is provided between an RFIC 76 and the receiving filter 72, and a power amplifier 75 is provided between the RFIC 76 and the transmitting filter 73. The power amplifier 75 performs power amplification on a transmission signal output from the RFIC 76. The RFIC 76 and a display apparatus 78 are connected to a baseband IC 77. The antenna matching circuit 101, the coupler 80, the demultiplexing/switching circuit 71, the receiving filter 72, and the transmitting filter 73 are configured as one front-end circuit (one module component) 70A.

The circuit portion other than the antenna matching circuit 101 in the front-end circuit 70A corresponds to a "high-frequency circuit" according to the present disclosure.

A phase detection circuit 81 is connected to the coupler 80, and an A/D converter 82 is connected between the phase detection circuit 81 and the CPU 83.

The phase detection circuit 81 detects the amplitudes and phases of two signals output from the coupler 80. The CPU 83 receives an AD conversion value of a detection signal of the phase detection circuit 81, and calculates a return loss or a reflection coefficient of the antenna 31 on the basis of this value. The CPU 83 controls the antenna matching circuit 101 such that the value becomes smaller. That is, the state of the switch 13 of the antenna matching circuit 101 is determined, and the value of the first variable capacitance element C1 and the value of the second variable capacitance element C2 are adjusted.

The environment near the antenna 31 greatly changes depending on a use state of the communication apparatus 308, which is a cellular phone terminal. The impedance of the antenna 31 changes with the change, and the impedance seen from the power feed circuit side changes. According to the present embodiment, the antenna matching circuit 101 is tuned such that the reflection from the antenna 31 becomes smaller, and thus matching between the antenna and the power feed circuit may be always achieved.

Figure 21:
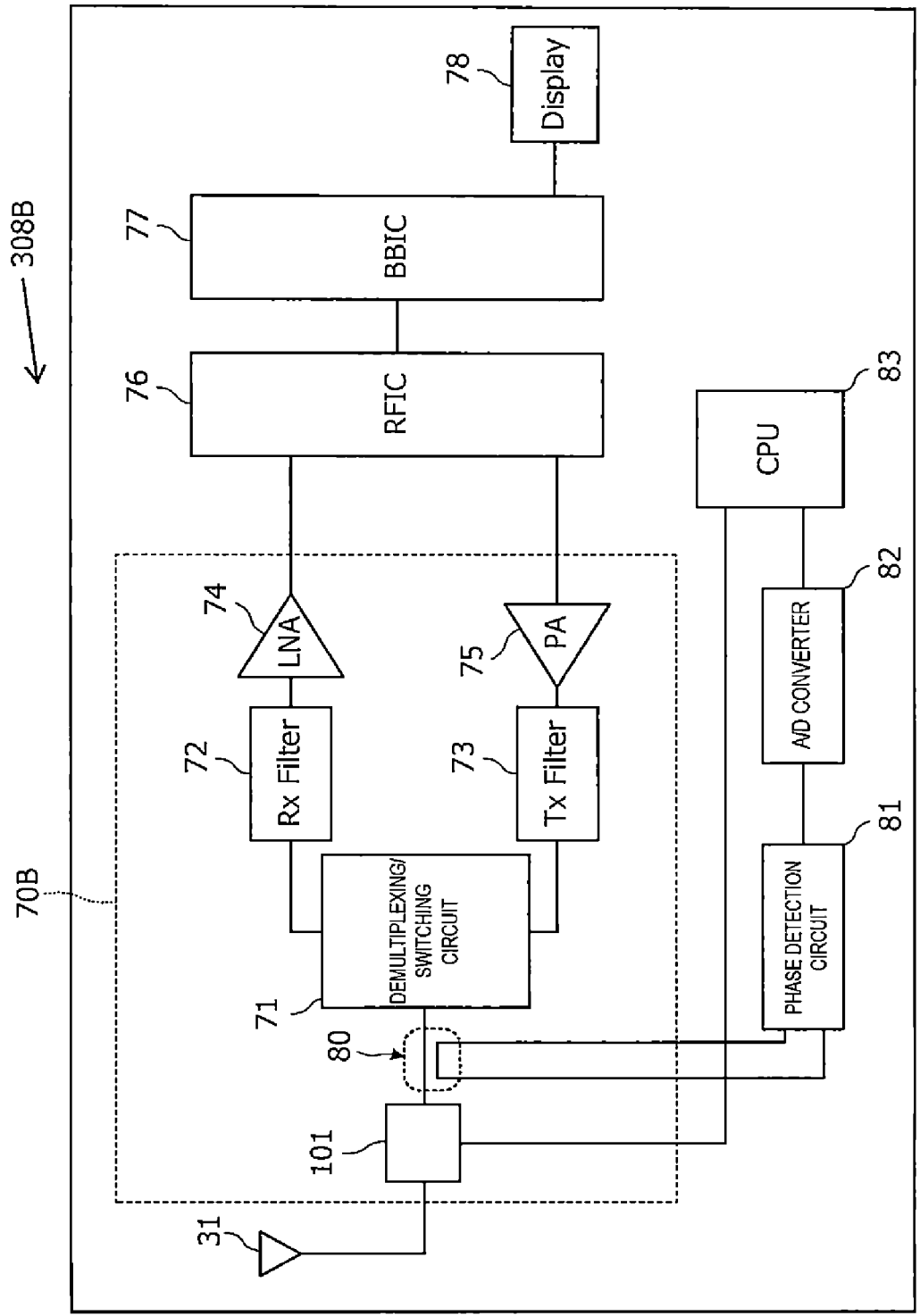
FIG. 21 is a block diagram of another communication apparatus 308B according to the eighth embodiment.

FIG. 21 is a block diagram of a communication apparatus 308B according to the eighth embodiment. The configuration of a front-end circuit differs from that of the front-end circuit of the communication apparatus 308A illustrated in FIG. 20. An antenna matching circuit 101, a coupler 80, a demultiplexing/switching circuit 71, a receiving filter 72, a transmitting filter 73, a low noise amplifier 74, and a power amplifier 75 constitute one front-end circuit (one module component) 70B of the communication apparatus 308B. The rest of the configuration is the same as that of the communication apparatus 308A.

The circuit portion other than the antenna matching circuit 101 in the front-end circuit 70B corresponds to a "high-frequency circuit" according to the present disclosure.

In this manner, the front-end circuit 70B may include the power amplifier 75. Note that the low noise amplifier 74 may be included in the front-end circuit 70B as illustrated in FIG. 21, or may also be provided outside the front-end circuit 70B.

According to the present embodiment, the number of components is reduced by using the antenna matching circuit 101 including the front-end circuit 70A, 70B. In addition, the antenna matching circuit 101 may deal with a wide range of change in the impedance of the antenna 31, and thus the front-end circuit 70A, 70B may be used as a very versatile module component.

Lastly, the descriptions of the embodiments above are mere examples in all points and are not restrictive. Those skilled in the art may make modifications and changes as necessary. For example, the configurations illustrated in different embodiments may be partially replaced or combined. The scope of the present disclosure is indicated not by the embodiments above but by the claims. Furthermore, the scope of the present disclosure is intended to include equivalents for the claims and all changes within the claims.

C1 first variable capacitance element
C2 second variable capacitance element
L1 first inductor
L2 second inductor
P1 first port
P2 second port
P3 third port
Pa antenna port
Pf power feed port
11 first circuit
12 second circuit
13 switch
21 power feed circuit, first power feed circuit
22 second power feed circuit
30 antenna
31 antenna, first antenna
32 second antenna
40 transmission line
41 transmission line, first transmission line
42 second transmission line
50 diplexer
51 low pass filter
52 high pass filter
60 circuit board
61 IC
70 front-end circuit
71 switching circuit 72 receiving filter
73 transmitting filter
74 low noise amplifier
75 power amplifier
76 RFIC
78 display apparatus
80 coupler
81 phase detection circuit
82 A/D converter
83 CPU
101 antenna matching circuit
103H antenna matching circuit
112 antenna matching circuit module
201, 202, 203, 204, 205, 207 antenna circuit
308 communication apparatus

The invention claimed is:

1. An antenna matching circuit including a first circuit that is connected between a power feed port and an antenna port, and a second circuit that is connected between the power feed port and ground or between the antenna port and ground, the antenna matching circuit comprising:
a switch configured to selectively connect the second circuit between a first state and a second state, the first state connecting the second circuit between a first end of the first circuit and ground, and the second state connecting the second circuit between a second end of the first circuit and ground,
wherein the first end of the first circuit is connected to the power feed port and the second end of the first circuit is connected to the antenna port, and
wherein according to an expression of an impedance of an antenna connected to the antenna port using a reflection coefficient:
the switch connects the second circuit in the first state when a real part of the reflection coefficient is negative, and
the switch connects the second circuit in the second state when the real part of the reflection coefficient is positive.

2. The antenna matching circuit according to claim 1, wherein:
the first circuit comprises a first variable capacitance element connected in series with a first inductor, and
the second circuit comprises a second variable capacitance element connected in parallel with a second inductor.

3. The antenna matching circuit according to claim 2, wherein the first variable capacitance element, the second variable capacitance element, and the switch are included in a single integrated circuit.

4. An antenna circuit comprising:
the antenna matching circuit according to claim 1; and
a first antenna that is connected to the antenna port and that is for a first communication frequency band.

5. The antenna circuit according to claim 4, further comprising:
a second antenna for a second communication frequency band, the second communication frequency band being higher than the first communication frequency band;
a second power feed circuit that is connected to the second antenna and that is for the second communication frequency band; and
a low pass filter at the antenna port, wherein the low pass filter has a cutoff frequency between the first communication frequency band and the second communication frequency band.

6. The antenna circuit according to claim 5, wherein the low pass filter has an impedance transformation function for the first antenna and the antenna matching circuit.

7. The antenna circuit according to claim 5, further comprising a high pass filter between the second power feed circuit and the second antenna, wherein the high pass filter has a cutoff frequency between the first communication frequency band and the second communication frequency band is provided.

8. The antenna circuit according to claim 7, wherein the high pass filter has an impedance transformation function for the second antenna and the second power feed circuit.

9. A communication apparatus comprising:
an antenna circuit according to claim 4; and
a communication circuit connected to the antenna circuit.

10. A front-end circuit comprising:
the antenna matching circuit according to claim 1; and
a high-frequency circuit connected to the antenna matching circuit.

11. The front-end circuit according to claim 10, wherein the high-frequency circuit comprises a power amplifier configured to amplify a transmission signal.

12. An antenna circuit comprising:
a diplexer having a low pass filter between a first port and a third port, and a high pass filter between a second port and the third port;
an antenna connected to the third port of the diplexer;
a first power feed circuit configured to feed power to the antenna via the first port of the diplexer;
a second power feed circuit configured to feed power to the antenna via the second port of the diplexer; and
an antenna matching circuit according to claim 1 between the first power feed circuit and the first port of the diplexer.

13. The antenna circuit according to claim 12, wherein the low pass filter has an impedance transformation function for the antenna and the antenna matching circuit, or the high pass filter has an impedance transformation function for the antenna and the antenna matching circuit.

* * * * *